United States Patent
Jonczyk et al.

(10) Patent No.: US 7,975,833 B2
(45) Date of Patent: Jul. 12, 2011

(54) MATERIAL HANDLING SYSTEM AND METHOD

(75) Inventors: Ralf Jonczyk, Wilmington, DE (US); James A Rand, Landenberg, PA (US)

(73) Assignee: General Electric Company, Schenectady, NY (US)

( * ) Notice: Subject to any disclaimer, the term of this patent is extended or adjusted under 35 U.S.C. 154(b) by 449 days.

(21) Appl. No.: 12/173,248

(22) Filed: Jul. 15, 2008

(65) Prior Publication Data
US 2010/0012468 A1    Jan. 21, 2010

(51) Int. Cl.
*B65G 33/14* (2006.01)
(52) U.S. Cl. ......... 198/669; 198/662; 425/207; 425/208
(58) Field of Classification Search ............... None
See application file for complete search history.

(56) References Cited

U.S. PATENT DOCUMENTS

| 5,204,039 A | * | 4/1993 | Miyasaka et al. ........... 264/209.2 |
| 5,743,471 A | * | 4/1998 | Ivanov ............................. 241/16 |
| 6,193,053 B1 | | 2/2001 | Gaalswyk |
| 2004/0113302 A1 | * | 6/2004 | La Forest et al. ............ 264/29.1 |

FOREIGN PATENT DOCUMENTS
DE    538426 C1    11/1931
EP    0514325 A2   11/1992

* cited by examiner

*Primary Examiner* — Kavel Singh
(74) *Attorney, Agent, or Firm* — Ernest G. Cusiek; Frank A. Landgraff (57) ABSTRACT

A material handling system for moving material from a storage device to a receiver comprises a counter rotating double screw feeder extending from the storage device to the receiver. The counter rotating double screw feeder comprises an outer screw feed member; an inner screw feed member; where the outer screw feed member being positioned in an outer screw feed member tube; and the inner screw feed member being positioned in an inner screw feed member tube. The material is feed from the storage device to the process tube via the outer screw feed member; the inner screw feed member removes gas and byproducts from the receiver.

17 Claims, 5 Drawing Sheets

MATERIAL HANDLING SYSTEM AND METHOD

BACKGROUND OF THE INVENTION

This invention relates generally to a material handling system and method. In particular, the invention relates to a material handling system and method for silicon fines, for example, but not limited to, silicon fines moved to a melting apparatus or furnace. Further, the invention relates to a material handling system and method for melting silicon fines and extracting process byproducts, such as, but not limited to, silicon oxides (SiO, $SiO_2$, or $SiO_x$), hereinafter "silicon oxides".

Screw feeders are commonly used to feed powder in various processes and apparatuses. These screw feeders are generally conventional conveyor type screw feed apparatus, with little consideration for heat or other ambient conditions to receiver or associated apparatus to which the screw feeder is associated. For example, screw feeders do not generally consider aspects of the apparatus or receiver for the screw feeder. Known screw feeders, especially those for fines, are not known to be concerned with any exhaust from the receiver or the associated apparatus. Also, known screw feeders are not seen to be concerned with ambient temperature considerations in the receiver or the associated apparatus. Moreover, known screw feeders, if a double screw-type arrangement, are not known to use a shaft of one screw as the tube for a second screw.

Accordingly, a screw feed device is provided that considers the ambient conditions of the receiver or associated apparatus. Moreover, a screw feed device is provided to feed silicon to a furnace receiver, while simultaneously removing the undesirable silicon oxide byproduct, which can be realized with a dual screw feed device.

BRIEF DESCRIPTION OF THE INVENTION

One aspect of the invention sets forth a material handling system for moving material from a storage device to a receiver, where the material handling system comprises a counter rotating double screw feeder extending from the storage device to the receiver. The counter rotating double screw feeder comprises an outer screw feed member; an inner screw feed member; where the outer screw feed member being positioned in an outer screw feed member tube; and the inner screw feed member being positioned in an inner screw feed member tube. A process tube positions the counter rotating double screw feeder in a material handling orientation with the storage device and receiver. The process tube may comprise a flared end in the receiver to enhance flow of material into the receiver. The material is feed from the storage device to the receiver via the outer screw feed member; the inner screw feed member removes gas and byproducts from the receiver.

Another aspect of the invention comprises a method for moving material from a storage device to a receiver. The method comprises providing a counter rotating double screw feeder extending from the storage device to the receiver. The counter rotating double screw feeder comprises an outer screw feed member; an inner screw feed member; the outer screw feed member being positioned in an outer screw feed member tube where the outer screw feed member tube comprises a flared end to enhance flow of material into the furnace; and the inner screw feed member being positioned in an inner screw feed member tube moving material from the storage device to the receiver via the outer screw feed member; and removing gas and byproducts from the receiver the inner screw feed member.

These and other aspects, advantages and salient features of the invention will become apparent from the following detailed description, which, when taken in conjunction with the annexed drawings, where like parts are designated by like reference characters throughout the drawings, disclose embodiments of the invention.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

As used herein, an element or step recited in the singular and proceeded with the word "a," "an," or "one" (and especially, "at least one") should be understood as not excluding plural said elements or steps, unless such exclusion is explicitly stated. Furthermore, references to "one embodiment" (or to "other embodiments") of the present invention are not intended to be interpreted as excluding either the existence of additional embodiments that also incorporate the recited features or of excluding other features described in conjunction with the present invention. Moreover, unless explicitly stated to the contrary, embodiments "comprising" or "having" an element or a plurality of elements having a particular property may include additional such elements not having that property.

Figure 1:
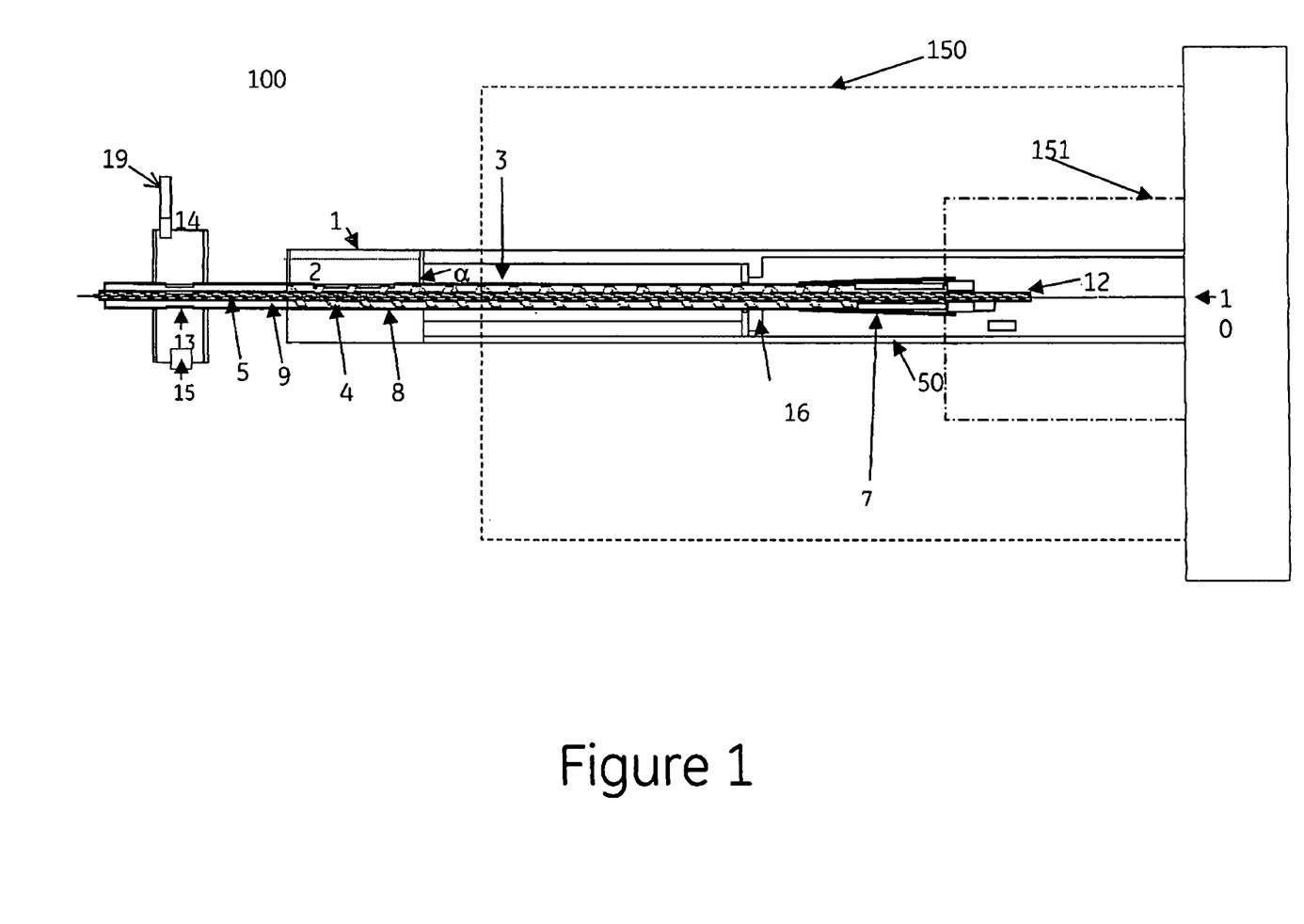
FIG. 1 is a schematic illustration of a material handling system including a supply hopper comprising a double screw feeder, as embodied by the invention.
Figure 2:
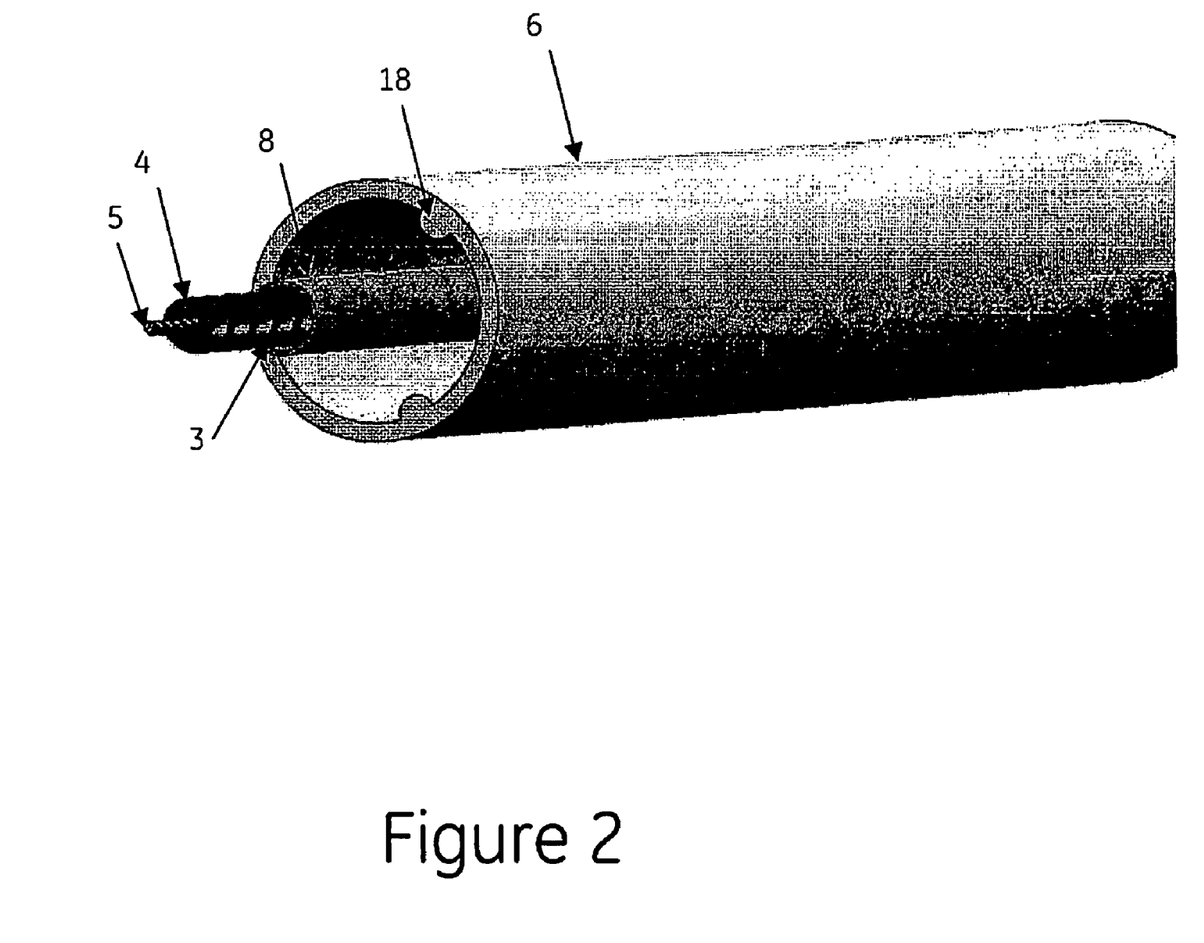
FIG. 2 is schematic illustration of the material handling device comprising a double screw feeder, as embodied by the invention.
Figure 3:
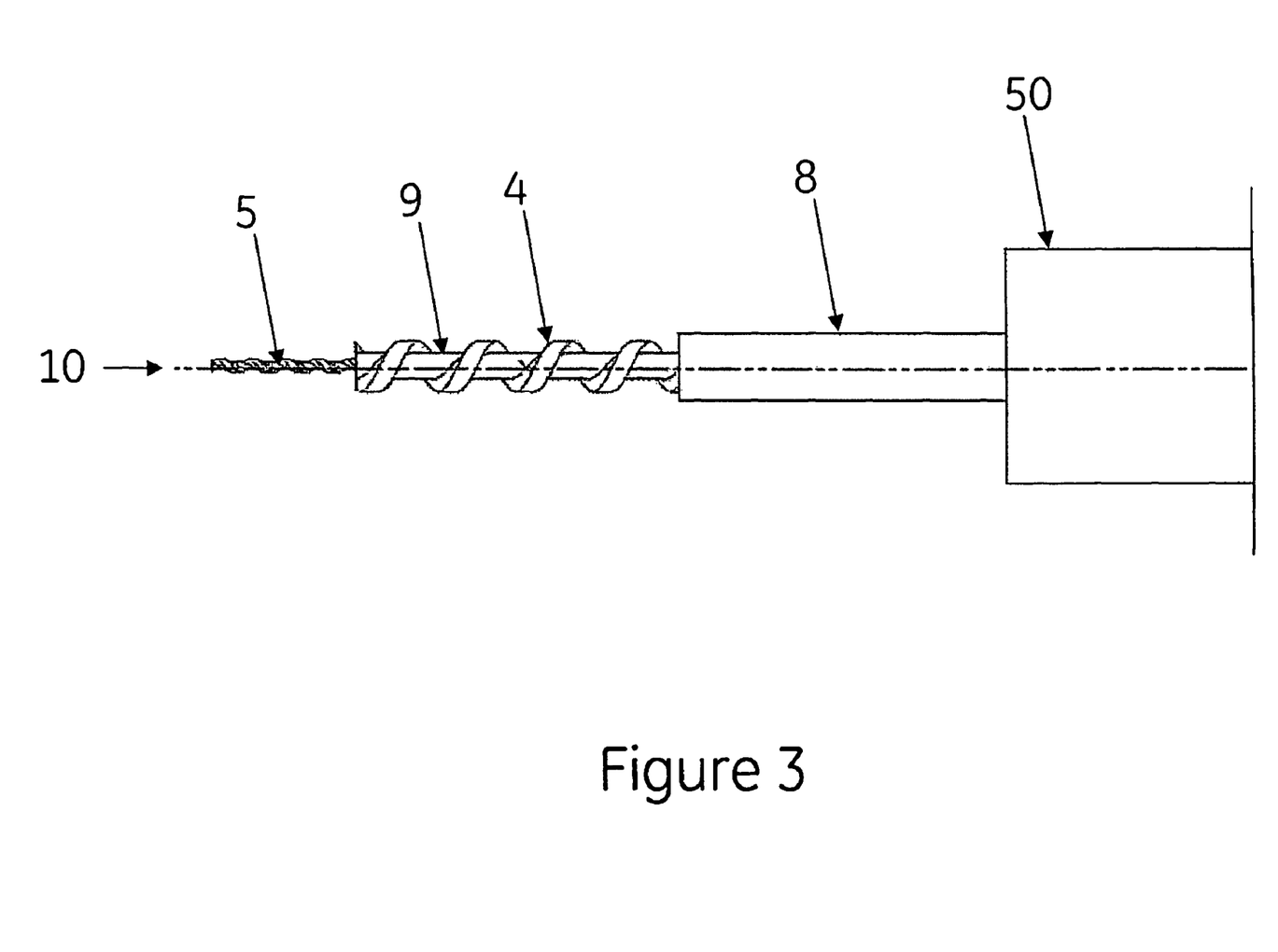
FIG. 3 is side-sectional schematic illustration of the material handling device comprising a double screw feeder, as embodied by the invention.
Figure 4:
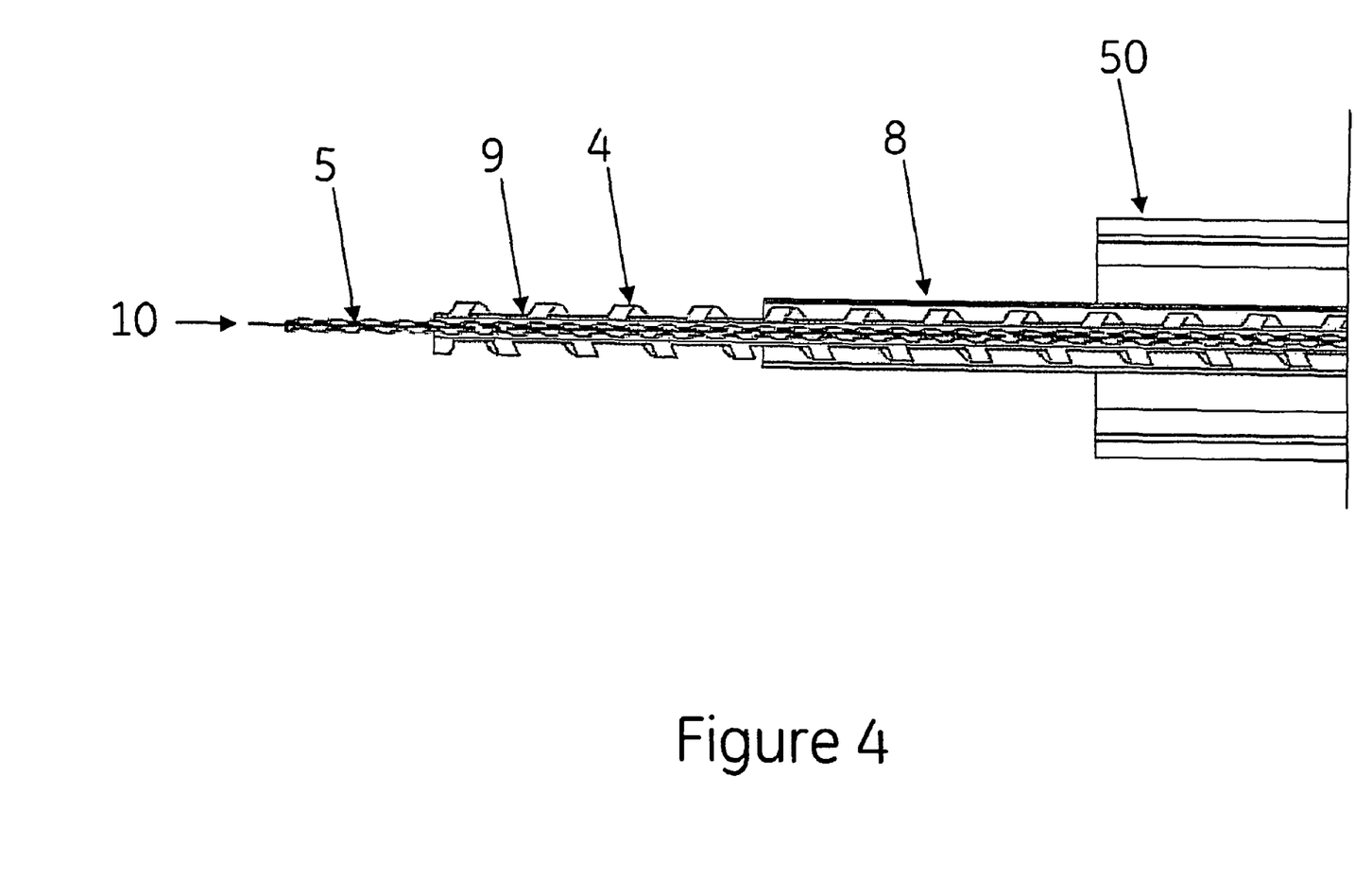
FIG. 4 is side-sectional schematic illustration of the material handling device comprising a double screw feeder, as embodied by the invention.

This invention provides a material handling device 100 and associated method. The device 100, as illustrated in FIG. 1 comprises a counter rotating double screw feeder 3 that is operably connected to a storage device, such as, but not limited to, a hopper 1, which contains powder, here silicon powder or fines 2. The description of the powder as silicon or silicon fines is exemplary and not intended to limit the invention in any manner. Other powder is contemplated by the invention, for example, carbon fines, gypsum, $Al_2O_3$, or other known powders. The hopper 1 comprises an open bottom that is open to the outer most feed screw 4, which rotates in such a direction that carries fine silicon powder into a hot zone 151 (the hot zone defined as a portion of the furnace 150 where the temperature is greater than about 1415 C) of a receiver, such as, but not limited to, a furnace 150 Thus, the hopper 1 can feed powder, such as, but not limited to, silicon 2 to the counter rotating double screw feeder 3, as embodied by the invention.

The counter rotating double screw feeder 3, as embodied by the invention, comprises an outer screw feed member 4 and an inner screw feed member 5. The outer screw feed member 4 is a hollow screw feed member with central bore there through which the inner screw feed member 5 is positioned. The outer screw feed member 4 is positioned in an outer screw feed member tube 8, while the inner screw feed member 5 is positioned in an inner screw feed member tube 9. Alternatively, the inner screw feed member tube 9 may be formed as part of the outer screw feed member 4, either as element formed at the same time or formed separately and them joined as a single piece. For example, but in no way limiting of the invention, these elements can be machined out of one piece of silicon nitride (Si3N4). Each of the outer screw feed member 4, inner screw feed member 5, outer screw feed member tube 8, and inner screw feed member tube 9 are aligned on an axis 10, so as to be coaxial in process tube 6, as embodied by the invention.

The counter rotating double screw feeder 3 and its associated elements are positioned in process tube 6; in a material handling orientation with the hopper 2 and a collection chamber 14 (to be described hereinafter). The material handling orientation, as embodied by the invention, allows flow of the silicon 2 into the counter rotating double screw feeder 3, either under the flow of gravity, with an assist (positive pressure on the powder 2, such as silicon, force applied to a top surface of the silicon 2, agitation of the powder 2 and/or hopper 1, or the like assistance) or combinations thereof. The material handling orientation also allows the collection chamber 14 to collect and separate silicon oxide from process gas a furnace 150 (in phantom) through the inner screw feed member 5 and the inner screw feed member tube 9. The inner screw feed member 5 rotates in a direction opposite to the outer screw member 4, such that the inner screw member 5 acts to remove condensed silicon oxide condensing in inner screw feed member tube 9 which acts as process gas outlet. It is desirable for SiO to condense in inner screw feed member 5 rather than on other parts of the furnace, the feedstock or the final product.

The counter rotating double screw feed device is formed from a material or materials that allows for efficient and effective transfer of powder, for example silicon 2, to the furnace 150 from the hopper 1, as well allow for the return of process gas and condensed solids (such as SiO) from the furnace. For example, as embodied by the invention, the outer screw feed member 4 may be formed from a ceramic material. Such ceramic materials include, but are not limited to, $Si_3N_4$, SiC, $Al_2O_3$, Si, $SiO_2$, and combinations thereof, or similar materials. Moreover, each of the outer screw feed member 4, inner screw feed member 5, outer screw feed member tube 8, and inner screw feed member tube 9 can also be formed from a ceramic material. As embodied by the invention, the ceramic material of the outer screw feed member 4, inner screw feed member 5, outer screw feed member tube 8, and inner screw feed member tube 9 can also be, but are not limited to, $Si_3N_4$, SiC, $Al_2O_3$, Si, $SiO_2$ and combinations thereof, or similar materials.

Moreover, counter rotating double screw feeder 3, as embodied by the invention extends into the furnace 50 to simultaneously load powder 2 into the process tube 6 and extract byproduct process gases from the process tube 6. The outer guide tube 8 of the counter rotating double screw feeder 3 extend only partly into the furnace 150 hot zone 151 and is extended by a flared discharge end 7. The flared discharge end 7, as embodied by the invention, is provided to avoid compacting of the powder 2 inside outer guide tube 4 where no outer screw feed member 4 is present. Inner screw feed member 5, inner screw feed member tube 9, extend beyond the end of flared discharge tube 7 to prevent silicon powder deposited into process tube 6 from being carried out of process tube 6 along with the process gas, as illustrated in FIG. 1.

Alternatively, as embodied by the invention, the outer screw feed member 4, inner screw feed member 5, outer screw feed member tube 8, and inner screw feed member tube 9 of the counter rotating double screw feeder 3 could extend all the way into the hot zone 151, with further enhancements of materials. For example, any and all of the outer screw feed member 4, inner screw feed member 5, outer screw feed member tube 8, and inner screw feed member tube 9 of the counter rotating double screw feeder 3 can be coated with temperature resistant coatings.

The silicon 2, if provided as the powder in the invention, will react in the furnace 150 with any available source of oxygen, such as quartz to form furnace byproducts, such as, but not limited to, silicon oxides (SiO, $SiO_2$, or $SiO_x$), hereinafter "silicon oxides. Any formed silicon oxide will condense right below the melting point of silicon. This silicon oxide condensate is not desirable in the system 100, as it may adversely affect the flow of powder 2, such as, but not limited to, silicon to the furnace 150 and/or the return of gas back through the counter rotating double screw feeder 3, as well as deposit on finished product. Accordingly, as embodied by the invention, the system 100 provides structure and operations to extract process gas, which contains the powder, such as but not limited to silicon oxide, from the furnace 150.

To extract process gas and byproducts from the furnace 150, the counter rotating double screw feeder 3 provides the outer screw feed member 4 moving the powder 2 from the hopper 1 into the furnace by rotating in one direction in its outer screw feed member tube 8, while the inner screw feed member 5 in its inner screw feed member tube 9 rotates in an opposite or counter direction in the counter rotating double screw feeder 3. With the arrangement of the inner screw feed member 5 in the hollow shaft of the outer screw feed member 4 powder, the inner screw feed member 5 can break up, and if necessary, convey out any silicon oxide that deposits/condenses inside the outer screw feed member tube 8. Alternatively, the inner screw 5 could be replaced with a stationary scraping device using the relative motion of the outer screw member 4, which also acts as the inner screw feed member tube 9 to break up silicon oxide deposit inside the inner tube member 9.

Byproducts and process gas can be conveyed through the inner screw feed member 5 and the inner screw feed member tube 9 into a collection chamber 14, as embodied by the invention. The collection chamber 14 provides for the removal of collected byproducts from the process gas, which can then be, discharged ore recycled. For example, the collection chamber 14 may be formed as a velocity drop box that can separate powder from gas. Alternatively, the collection chamber 14 may comprise a collection chamber 14 with an access port 15 for the collection of byproducts, where the byproducts can settle under the influence of gravity. The collection chamber 14 includes a vent or other process gas port 19, for the removal of process gas from the collection chamber 14. The process gas port 19 of the collection chamber 14 may comprise at least one of a vent to atmosphere, a vent to processing or scrubbing equipment (not illustrated), and a pressure assist device, such as, but not limited to, a vacuum removal device (not illustrated). Moreover, as embodied by the invention, the collected byproducts can be periodically removed from the collection chamber 14, or alternatively continuously removed from the collection chamber 14, for example, but not limited to, a conveyor or like removal device (not illustrated). Alternatively, the exhaust gas can be bubbled through a liquid to strip off any solids, such as silicon oxide. The liquid could be replace continuously, or discontinuously.

The counter rotating double screw feeder 3, as embodied by the invention, can be oriented at a slight angle α to an orthogonal of the system 100 with respect to the hopper 1. The slight angle α with which the counter rotating double screw feeder 3 is positioned to the hopper 1, can be provided by at least one of positioning process tube 6 at the slight angle α with respect to the hopper 1, positioning the outer screw feed member 4, inner screw feed member 5, outer screw feed member tube 8, and inner screw feed member tube 9 at the slight angle α with respect to at least one of the hopper 1 and the process tube 6, or combinations thereof. The slight angle α assists in the discharge of powder 2 through the counter rotating double screw feeder 3 and the discharge tube 6 and into the furnace 150. As embodied by the invention, the angle α provides the counter rotating double screw feeder 3 at a small angle, such as an angle α less than about 10 degrees from orthogonal. Further, as embodied by the invention, the angle α can be less than about 10 degrees from orthogonal. Furthermore, the angle α can be between about 0.5 degree to about 3 degrees from orthogonal.

Moreover, as embodied by the invention, the furnace 150 can be positioned at an angle α to from system orthogonal, to assist in the discharge of liquefied silicon from the furnace 150. The furnace 150 being positioned at an angle α to from orthogonal, assists in the discharge of liquefied silicon as a process control of the powder 2 delivery to the furnace 150 and the liquefaction process in the furnace 150 and also a discharge of liquefied silicon from the furnace 150. Moreover, the furnace 150 may have its angle α adjustable to further assist in the discharge of liquefied silicon from the furnace 150, and its function as a process control. The furnace 150 may have its angle α adjustable by any appropriate means, such as, but not limited to, positioning the furnace 150 on a lift, movable skid, tiltable platform, movable mount or the like, which enables relative movement of the furnace 150 with respect to the system 100. Additionally, the invention further contemplates that the system 100 may be adjustable to further assist in the discharge of liquefied silicon from the furnace 150, and its function as a process control. As such, the system 100 may be adjustable to further assist in the discharge of liquefied silicon from the furnace 150 via similar means as the adjustability of the furnace 150. Further, the angle α is also adjustable with respect to the counter rotating double screw feeder 3 and the remainder of the system orthogonal.

As the temperature of the powder 2, as it approaches the furnace 150, rises to near its melting point, the powder 2, such as silicon powder, the powder can become "sticky" and adhere to itself. Further, the powder 2, as it rises to near its melting point, the powder 2 can compact and may back up into the cooler parts of the process tube 6 and ultimately interfere with proper furnace 150 operation. To avoid possible adverse affects of powder back up, or to move back up in the process tube 6, and also from the powder sticking to itself in the process tube 6 and the counter rotating double screw feeder 3, a collar baffle 16 (FIGS. 1 and 6) can be placed inside the process tube 6. As embodied by the invention, the collar baffle 16 can be attached to the process tube 6 by appropriate means, such as, but not limited to welding the collar baffle 16 to the process tube 6, friction fit in the process tube 6, mechanically connecting, or otherwise fit in the process tube 6 by other means.

Figure 6:
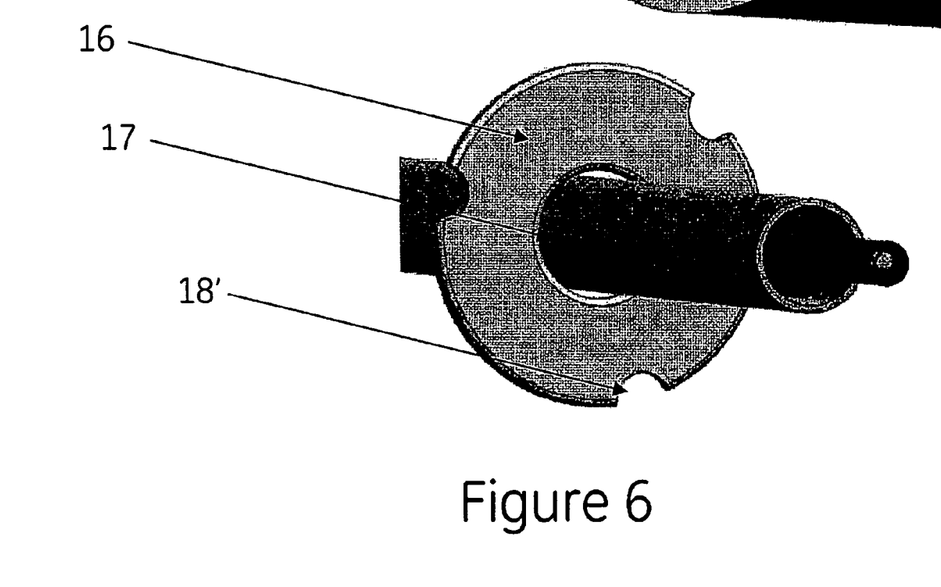
FIG. 6 is schematic illustration of the collar baffle for the double screw feeder in a tubular process, as embodied by the invention.

The collar baffle 16 is formed with collar baffle cut-outs 18 for acceptance of stabilizing guide rods 18, as discussed hereinafter. Further, as embodied by the invention, the collar baffle 16 is formed from a material that does not adversely affect the operation of the system 100, and its components, as described herein. For example, and in no way limiting of the invention, the collar baffle 16 comprises quartz or quartz materials. The collar baffle 16, as embodied by the invention, can be formed as a separate element from the counter rotating double screw feeder 3 and the process tube 6, and slid over the counter rotating double screw feeder 3 with an aperture 17 formed in the collar baffle 16 accepting the counter rotating double screw feeder 3. The cut-outs 18' accept stabilizing guide rods 18, thus positioning the collar baffle 16 in the process tube 6. The collar baffle 16 can be inserted on the process tube 6 as a separate element, and can be removed when any part of the counter rotating double screw feeder 3 or the process tube 6 needs maintenance or replacement.

Figure 5:
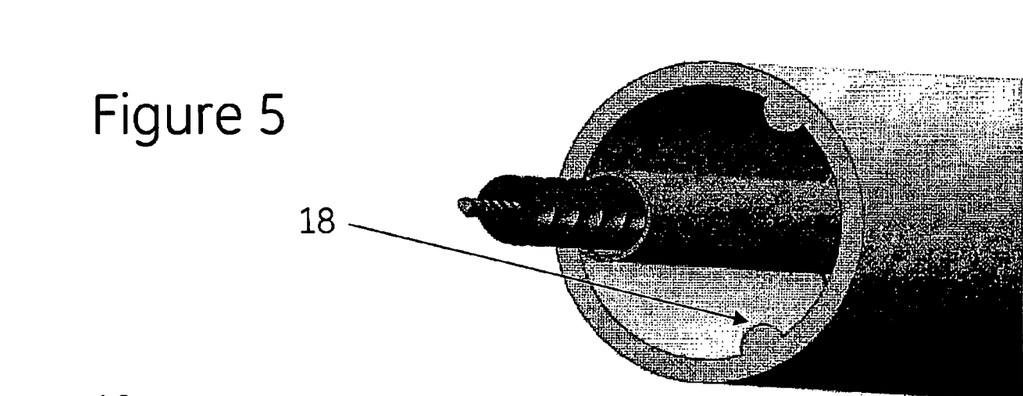
FIG. 5 is a schematic illustration of the process tube of the tubular process, as embodied by the invention.

To increase the stability of the process tube 6 in the system 100, the process tube 6 may comprise stabilizing structure therein. As embodied by the invention, the stabilizing structure can comprise stabilizing guide structures or stabilizing guide rods 18. These stabilizing guide rods 18 are positioned on the interior periphery of the process tube 6, as schematically illustrated in FIG. 5. The stabilizing guide 18 can be formed as quartz rods 18 positioned on the inside of the process tube 6. As illustrated there are few guide rods 18 positioned on the interior of the process tube 6, and while illustrated as circular in cross section, these stabilizing guide rods 18 can have any stabilizing configuration, such as, but not limited to, rectangular, triangular, "I"-beam, or any other such configuration that provides stabilization. The stabilizing guide rods 18 connected to the process tube 6 will guide the collar baffle 16 through cooperation with the collar baffle cut-outs 18', thus keeping the collar baffle 16 in place in the process tube as the while the counter rotating double screw feeder 3 and its components rotate.

Further, as embodied by the invention, the counter rotating double screw feeder 3 inner screw feed member 5, which is acting to remove condensed silicon oxide and gas from the furnace 150 can be actively cooled. The cooling of the inner screw feed member 5 can be by appropriate cooling means (not illustrated for facilitating understanding of the invention), such as, but not limited to, cooling with gas or liquid coolant. Additionally, as embodied by the invention, the inner screw feed member tube 9 that separates the outer screw feed member 4 from the inner screw feed member 5 can be constructed to insulate the inner screw feed member 5 from the process tube 6, especially where the process tube 6 extends into the furnace 150. Accordingly, an inner surface of the inner screw feed member tube 9 would be cooler than its outer surface, encouraging condensation on the inner surface, where the inner screw feed member 5 can easily remove the condensation.

Accordingly, the system 100, as embodied by the invention, can feed powder into a hot zone 151 of a furnace 150, such as, but not limited to, a rotary furnace. The system 100, as embodied by the invention, allows for the extraction of gas from the furnace 150 preventing powder from backing up in the process tube 6. Accordingly, the system 100 permits long term or continuous operation in an environment where powder 2 is fed into a furnace.

Moreover, the system 100, as embodied by the invention, can be used to feed silicon powder 2 into a furnace 150 for forming materials, such as, but not limited to, high purity molten silicon. The high purity silicon can be used for forming photovoltaic devices, panels, solar panels or other devices that employ such silicon. Furthermore, the system 100, as embodied by the invention, with the flared end 7 of the outer tube member 8 allows material to be fed directly into the furnace 150 without requiring the outer screw member 4 to be extended fully into the furnace 150 hot zone 151. The flared end 7 can prevent packing of the powder 2, which pack and jam inside the outer tube member 8. Additionally, the counter rotating double screw feeder 3 with the outer screw feed member 4 and inner screw feed member 5 rotating counter to the outer screw feed member 4 can allow gas and powder to be extracted in a system with only one access point available.

Alternatively, the inner screw feed member 5 and its inner screw feed member tube 9 could be placed at a point of entry, remote from the outer screw feed member 4 and its outer screw feed member tube 8, where each communicates with the furnace 150, such as at a location on the furnace 150 proximate where the molten silicon exits. Placing the inner screw feed member 5 as illustrated, as shown, is preferred, and the byproducts, such as, but not limited to, silicon oxide, will be formed that end, and single rotating double screw feeder 3 for both feeding powder and extracting byproducts allows for enhanced management of the equipment for cleaning, maintenance, and replacement of consumable parts.

Also, the collar baffle 16, as embodied by the invention, can prevent powder 2 from backing up in at least one of the process tube 6 and or the counter rotating double screw feeder 3 towards the end of the tube that is remote from the furnace 150, where backing up could be disruptive and result in shutting down the system 100. Also, providing the collar baffle 16 as a modular unit insertable into the system 100, as described above, can allow for in-situ cleaning of the system 100.

While the invention has been described in terms of various specific embodiments, those skilled in the art will recognize that the invention can be practiced with modification within the spirit and scope of the claims.

What is claimed is:

1. A material handling system for moving material from a storage device to a receiver, the system comprising:
   a counter rotating double screw feeder extending from the storage device to the receiver; the counter rotating double screw feeder comprising:
   an outer screw feed member;
   an inner screw feed member;
   the outer screw feed member being positioned in an outer screw feed member tube; and
   the inner screw feed member being positioned in an inner screw feed member tube; and
   a process tube positioning the counter rotating double screw feeder in a material handling orientation with the storage device and receiver; wherein material is feed from the storage device to the receiver via the outer screw feed member; the inner screw feed member removes gas and byproducts from the receiver; and wherein at least one of the outer screw feed member, inner screw feed member, outer screw feed member tube, and inner screw feed member tube comprise ceramic material, the ceramic material selected from the group comprising $Si_3N_4$, SiC, $Al_2O_3$, Si, $SiO_2$, and comibination thereof.

2. A system according to claim 1, wherein each of the outer screw feed member, inner screw feed member, outer screw feed member tube, and inner screw feed member tube are aligned on a common axis.

3. A system according to claim 2, wherein each of the outer screw feed member, inner screw feed member, outer screw feed member tube, and inner screw feed member tube are aligned are coaxial in the process tube.

4. A system according to claim 2, wherein the outer screw feed member comprises a hollow screw feed member with a central bore there through, the inner screw feed member being positioned in the central bore.

5. A system according to claim 1, wherein the inner screw feed member tube comprises a part of the outer screw feed member.

6. A system according to claim 5, wherein the inner screw feed member tube and the outer screw feed member are machined out of one piece of silicon nitride (SiN), wherein the inner screw feed member tube forms a shaft of the outer screw feed member.

7. A system according to claim 1, wherein the receiver comprises a furnace and the material comprises silicon powder, so the furnace metals the silicon powder, and the inner screw feed member removes gas and silicon oxide byproducts from the furnace.

8. A system according to claim 7, wherein the counter rotating double screw feeder and the flared discharge end of the process tube extends a hot zone of the furnace.

9. A system according to claim 7, wherein at least one of the counter rotating double screw feeder, the furnace and the storage device are oriented at angles to at least one of each other and a system orthogonal to facilitate the moving of silicon powder from the storage device through the counter rotating double screw feeder to the furnace.

10. A system according to claim 9, wherein at least one of the angles orienting the counter rotating double screw feeder, the furnace and the storage device are adjustable.

11. A system according to claim 10, wherein at least one of the angles orienting the counter rotating double screw feeder, the furnace and the storage device are adjustable up to 5 degrees from at least one of each other and the system orthogonal.

12. A system according to claim 1, wherein the storage device comprises a collection chamber, the collection chamber separating gas and byproducts removed from the receiver by the inner screw feed member.

13. A system according to claim 12, wherein the collection chamber comprises at least one collection port for byproducts and at least one process gas removal port.

14. A system according to claim 1, further comprising a collar baffle, the collar baffle being positioned in the process tube and comprising an aperture accepting the counter rotating double screw feeder, wherein the collar baffle prevents powder back up in the process tube.

15. A system according to claim 14, wherein the collar baffle further comprises cutouts on an outer periphery and the process tube comprises stabilizing guide rods, the stabilizing guide rods cooperating with the cutouts to further position the collar baffle in the process tube.

16. A method for moving material from a storage device to a receiver, the method comprising:
   providing a counter rotating double screw feeder extending from the storage device to the receiver; the counter rotating double screw feeder comprising:
   an outer screw feed member;
   an inner screw feed member;
   the outer screw feed member being positioned in an outer screw feed member tube; and
   the inner screw feed member being positioned in an inner screw feed member tube; and positioning the counter rotating double screw feeder in a material handling orientation with the storage device and receiver;

moving material from the storage device to the receiver via the outer screw feed member; and removing gas and byproducts from the receiver the inner screw feed member;

wherein positioning a process tube from the counter rotating double screw feeder in a material handling orientation with the storage device and receiver comprises:

positioning at least one of the counter rotating double screw feeder, the receiver and the storage device in a process tube at adjustable angles to each other facilitating the moving of silicon powder from the storage device through the counter rotating double screw feeder to the receiver.

17. The method according to claim 16, the receiver comprises a furnace and the material comprises silicon powder, wherein the furnace can melt the silicon powder, and the inner screw feed member can remove process gas and silicon oxide byproducts from the furnace.

* * * * *